United States Patent [19]

Huffman

[11] Patent Number: 4,480,289
[45] Date of Patent: Oct. 30, 1984

[54] ELECTRICAL COMPONENT SUPPORTED ON A SUPPORT MEMBER BY A RING MOUNT

[75] Inventor: John W. Huffman, Boise, Id.

[73] Assignee: Hewlett-Packard Company, Palo Alto, Calif.

[21] Appl. No.: 537,780

[22] Filed: Sep. 29, 1983

[51] Int. Cl.³ .............................................. H05K 7/08
[52] U.S. Cl. .................................. 361/403; 174/138 G
[58] Field of Search ....................... 174/138 G, 153 R; 361/400, 403, 418

[56] References Cited

U.S. PATENT DOCUMENTS

| | | | |
|---|---|---|---|
| 2,897,472 | 7/1959 | O'Brien | 174/153 R |
| 3,512,116 | 5/1970 | Miwa et al. | 174/138 G |
| 4,219,172 | 8/1980 | Murayama | 361/403 X |

FOREIGN PATENT DOCUMENTS 808494  2/1959  United Kingdom ............ 174/138 G

Primary Examiner—Laramie E. Askin
Attorney, Agent, or Firm—William H. MacAllister

[57] ABSTRACT

A mount is provided for electrolytic capacitors, the mount being in the form of a ring having an internal shoulder portion. On the opposite end of the mount from the end on which the shoulder portion is located is a groove containing a compressible O-ring. When the capacitor is inserted in the mount with its terminals extending downwardly to the surface of a circuit board, the top edge of the capacitor can rest on the shoulder of the ring mount. Screws are inserted from the opposite side of the circuit board and engage the terminals. Upon being tightened, the capacitor can is drawn downwards bringing the end of the capacitor can into firm engagement with the ring mount and causing it to compress the O-ring so as to provide a seal between the O-ring and the surface of the circuit board.

4 Claims, 2 Drawing Figures

ELECTRICAL COMPONENT SUPPORTED ON A SUPPORT MEMBER BY A RING MOUNT

BACKGROUND OF THE INVENTION

This invention relates to electrolytic capacitors and more particularly, to the mounting of electrolytic capacitors on a base plate, chassis or circuit board.

An electrolytic capacitor generally comprises a cylindrical metallic enclosure containing a plurality of capacitor elements or foils immersed in an electrolyte. Most electrolytic capacitors are provided with a pair of positive and negative electrodes or terminals projecting from one thereof. These electrodes usually have threaded portions for facilitating the attachment of electrical leads thereto. Such capacitors are larger in size and heavier in weight than most of the other electrical circuit components which may be mounted on a chassis or circuit board. The electrolytic capacitor, therefore, must be firmly mechanically mounted on the chassis or circuit board.

While most electrolytic capacitors are sufficiently sealed to contain the electrolyte therein, leakage of the electrolyte can and often does develop after the capacitor has been mounted on the circuit board. The electrolyte is usually a relatively harsh reacting chemical agent which will damage not only the chassis or circuit board but other electrical components with which it may come into contact.

U.S. Pat. No. 4,324,329 discloses a mounting member for an electrolytic capacitor. The mount disclosed in this patent is a cylinder molded from an elastic synthetic resin that comprises a network or web-like structure of diagonal stripes arranged diagonally with respect to the axis of the cylinder. The base of the cylindrical mount is a relatively thick disc of the resin which is integral with the cylindrical section. The cylindrical mount is secured to the chassis by means of screws which are threaded into a tapped hole in the base portion or are threaded into a nut encased within the base portion. Alternatively, the base portion may be provided with extensions of the resin material to extend through openings in the chassis and which may then be thermally fused in situ to form a widened end portion. Upon insertion of the electrolytic capacitor into the open end of the mount, the mount is subjected to a slight compressive effect because of the relationship of the internal diameter of the mount and the outside diameter of the capacitor. The mount thereby expands and thereby readily receives the capacitor.

U.S. Pat. No. 3,340,603 discloses another technique for mounting an electrolytic capacitor which requires a specially designed support member. At one end the support member is provided with a vertical lug having an opening therein and on the opposite end with horizontally projecting lugs. The electrolytic capacitor is provided at one end with at least one index lug which is inserted into the opening of the vertical lug on the support. A clip-like spring is then passed around the body of the electrolytic capacitor at its other end and engages the horizontally extending lugs at the corresponding end of the support member. It will be appreciated that this technique for mounting an electrolytic capacitor requires a specially constructed support member having the aforementioned lugs.

Still another method for securing an electrolytic capacitor to a circuit board is disclosed in U.S. Pat. No. 4,363,078. Here the capacitor is provided with an anchoring terminal which may be inserted through the circuit board and then bent over to hold the capacitor in place.

Probably the most common of capacitor mounting techniques is the clamp type, as sold by P. R. Mallory and Company, among others. These clamps comprise a cylindrical bracket which is secured to the circuit board by outwardly extending tabs. One side of the bracket is slit and the ends thereof are bent outwardly to permit drawing the bracket ends together by means of a screw or a nut and bolt combination. One end of the capacitor is inserted in the bracket and the aforementioned screw or bolt is tightened so as to compress the bracket around the capacitor cylinder and hold it in place.

BRIEF SUMMARY OF THE INVENTION

According to the present invention a mount in the form of a ring is provided for an electrolytic capacitor. The ring mount includes an internal shoulder portion and an inside surface of a diameter slightly larger than the diameter of the capacitor can itself. The ring is made of an imcompressible plastic material. On the surface of the ring opposite the shoulder portion and positioned therebeneath is a groove which is adapted to face the surface of the circuit board on which the capacitor is to be mounted. Within this groove a compressible O-ring is located. The capacitor is inserted so that its two electrodes or terminals extend down toward the surface of the circuit board with the top edge of the capacitor resting upon the shoulder portion of the ring mount. Screws, inserted from the opposite side of the circuit board, are threaded into the two terminals and, upon being tightened, draw the capacitor down toward the circuit board bringing the end of the capacitor can into firm engagement with the ring mount and causing it to sufficiently compress the O-ring so as to provide a seal between the O-ring and the surface of the circuit board. In this way not only is the electrolytic capacitor firmly mounted in place on the circuit board but the ring mount and its associated O-ring provide an effective seal around the end of the capacitor can. Should the seal of the capacitor cylinder fail for any reason, the ring mount and its associated O-ring will prevent the leakage from the electrolytic capacitor cylinder or at least will prevent the spread of any electrolyte from reaching other electrical components mounted adjacent the capacitor on the circuit board.

DETAILED DESCRIPTION OF THE INVENTION

Figure 1:
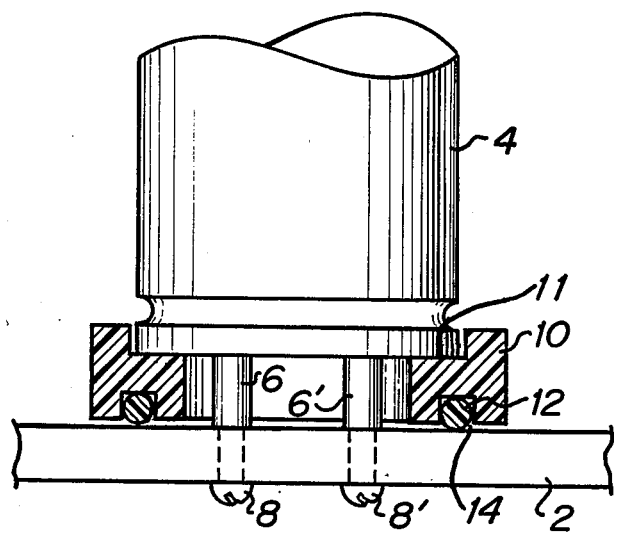
FIG. 1 is a side view, partly in section, of a portion of an electrolytic capacitor mounted on a circuit board by means of the ring mount of the present invention.
Figure 2:
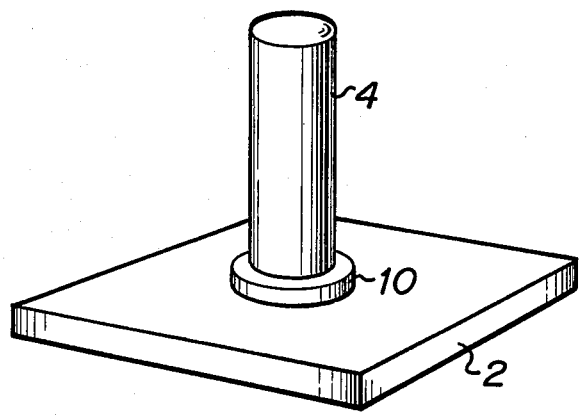
FIG. 2 is a perspective view of of an electrolytic capacitor mounted on a circuit board by means of the ring mount of the present invention.

Referring now to the drawings, an electrolytic capacitor 4 is shown comprising a cylindrical metallic can having at one end the capacitor electrodes or terminals 6 and 6'. The electrodes 6, 6' may be internally threaded so as to receive therein machine screws 8 and 8' respectively. Also shown is a printed circuit board 2 on which it is desired to mount the electrolytic capacitor 4.

In the preferred embodiment the mounting means for the electrolytic capacitor 4 is an incompressible plastic ring 10 having an internal, upwardly facing shoulder portion 11. The internal diameter of the plastic ring 10 above the shoulder portion 11 is just slightly larger than the diameter of the electrolytic capacitor 4 so that it may be snugly fitted over the end of the capacitor. The inside diameter of the shoulder portion 11 is less than the diameter of the capacitor can 4 so that the can rests upon the shoulder when inserted into the ring 10. The bottom surface of the mounting ring 10 is provided with a circular groove 14 in which is inserted a compressible O-ring 12 of rubber, for example, and of slightly larger diameter than the depth and width of the groove. The height of the shoulder portion 11 is slightly less than the length of the terminals 6, 6' so that the terminals 6, 6' rest upon the circuit board with a slight gap or clearance between the mounting ring 10 and the circuit board.

After the mounting ring 10 has been fitted on the end of the electrolytic capacitor 4, the electrode pins 6, 6' are aligned with corresponding holes in the printed circuit board 2. Machine screws 8, 8' are then inserted through the holes in the circuit board from the opposite side thereof and are threaded into the electrodes 6, 6' thus drawing the capacitor can and the mounting ring 10 down toward the printed circuit board and compressing and the O-ring 12 against the circuit board. The O-ring 12, in addition to providing a seal around the bottom or the mounting ring 10 also accommodates any manufacturing tolerances or variations in the length of the capacitor 6, 6'. As the O-ring 12 becomes compressed, firm mechanical support is provided for the capacitor around its circumference. In addition, should the seal at the end of the electrolytic capacitor can fail for any reason and electrolyte seep therefrom, it will be retained within the mounting ring.

There thus has been shown a novel mount for an electrolytic capacitor which requires less circuit board space than the mounting schemes of the prior art, particularly those mounts using clamps which are affixed to the surface of the printed circuit board by outwardly extending tabs. Furthermore, less mounting hardware is required by the mounting ring of the invention and the assembly time for mounting an electrolytic capacitor on a circuit board is shorter.

Alternatively, the mounting ring 10 may be made of a compressible material such as rubber, for example, and the groove 14 and the O-ring 12 may be dispensed with. In this case the mounting ring 10 itself is drawn toward and compressed against the circuit board 2 to establish the desired seal. In addition, a more effective seal is provided between the mounting ring and the capacitor can 4.

What is claimed is:

1. In combination, an electrical component having terminal means at a first end thereof, a support member for said electrical component having at least one opening therethrough, a ring member disposed on said support member having an internal shoulder portion on which said first end of said electrical component rests with said terminal means extending therethrough and being in alignment with said opening in said support member, and fastening means passing through said opening in said support member and engaging said terminal means for causing said electrical component to draw said ring member against said support member, thereby securing said electrical component to said support member.

2. The invention according to claim 1 in which said ring member is of compressible material.

3. In combination, an electrical component having terminal means at a first end thereof, a support member for said electrical component having at least one opening therethrough, a ring member disposed on said support member having an internal shoulder portion on which said first end of said electrical component rests with said terminal means extending therethrough and being in alignment with said opening in said support member, said ring member further including a groove in the surface thereof resting upon said support member, a compressible O-ring member mounted within said groove, and fastening means passing through said opening in said support member and engaging said terminal means for causing said electrical component to draw said ring member toward said support member and to compress said O-ring member against said support member, thereby securing said electrical component to said support member.

4. The invention according to claim 3 in which the height of said shoulder portion of said ring member is less than the height of said terminal means.

* * * * *